United States Patent [19]

Peroni

[11] 4,274,545
[45] Jun. 23, 1981

[54] INSTRUMENT HOUSING

[75] Inventor: Peter A. Peroni, Pottstown, Pa.

[73] Assignee: LaFrance Corporation, Philadelphia, Pa.

[21] Appl. No.: 48,591

[22] Filed: Jun. 14, 1979

[51] Int. Cl.³ .......................... B65D 6/00; H05K 5/02
[52] U.S. Cl. ................................. 220/4 R; 174/52 R;
220/76; 312/7 R; 312/111; 361/390
[58] Field of Search .................. 220/4 R, 75, 4 A, 76,
220/3.94, 8, 4 F, 4 C, 4 D; 312/7 R, 111, 242,
347, 140; 403/305, 306, 309, 310, 311, 313, 314;
455/347, 349; 361/390; 46/30, 31; 174/52 R

[56] References Cited

U.S. PATENT DOCUMENTS

| Re. 29,415 | 9/1977 | Ricobene et al. | 220/4 D X |
|---|---|---|---|
| 2,141,861 | 12/1938 | Hahn et al. | 220/75 X |
| 2,388,297 | 11/1945 | Slaughter | 46/30 X |
| 2,828,046 | 3/1958 | Weinman | 220/76 |
| 3,504,710 | 4/1970 | Pancoast | 220/76 X |
| 4,089,464 | 5/1978 | Teiti, Jr. et al. | 220/4 A |
| 4,090,632 | 5/1978 | Katzmann | 220/4 R |

FOREIGN PATENT DOCUMENTS

| 997082 | 12/1951 | France | 312/7 R |
|---|---|---|---|
| 1545867 | 11/1968 | France | 220/4 C |

Primary Examiner—Allan N. Shoap
Attorney, Agent, or Firm—Connolly and Hutz

[57] ABSTRACT

An instrument housing includes an expander which has an inner wall and an outer wall with the inner wall formed by spaced wall segments comprising inturned flanges at the ends of the outer wall and at least one plate shaped blade mounted to a rib projecting from the outer wall.

23 Claims, 25 Drawing Figures

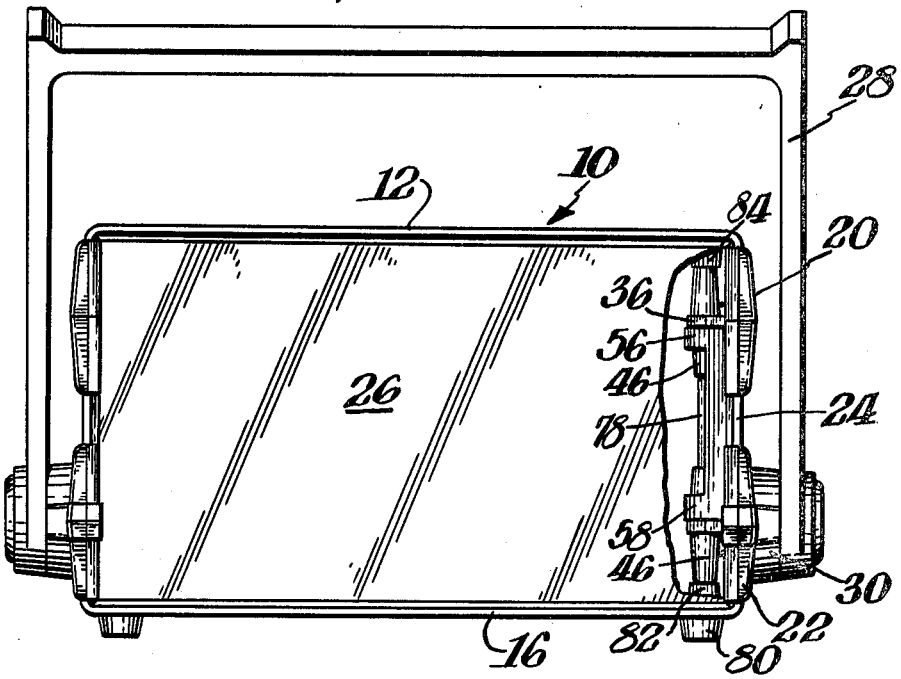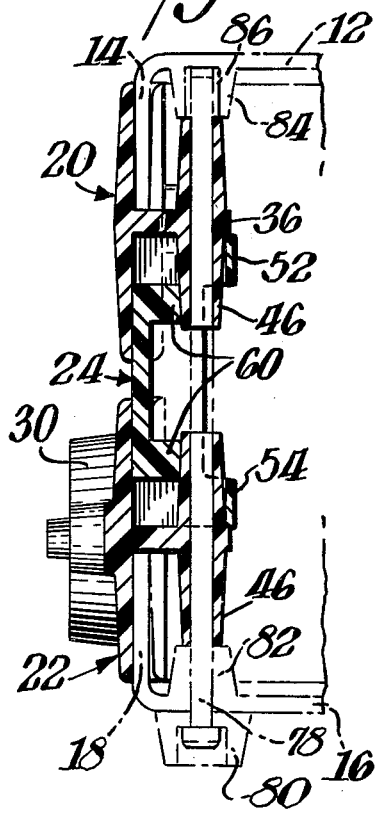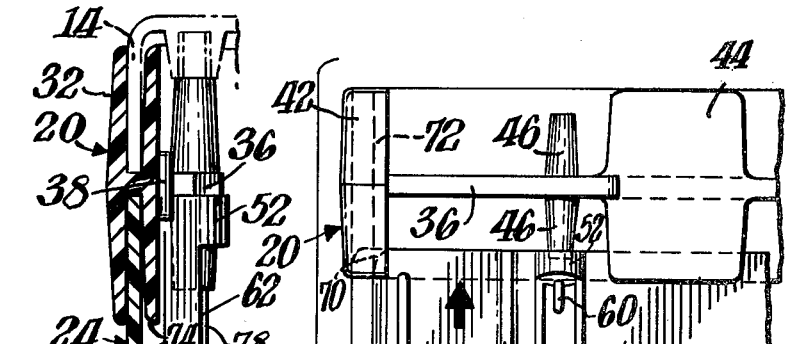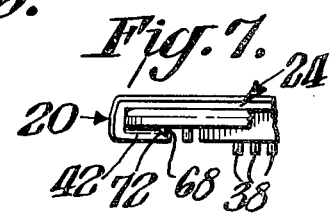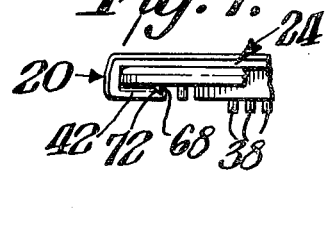

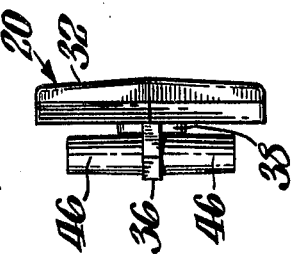
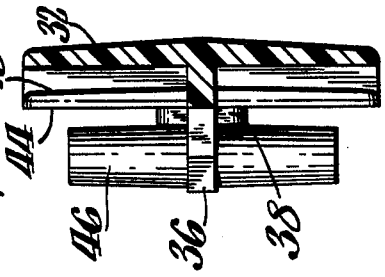
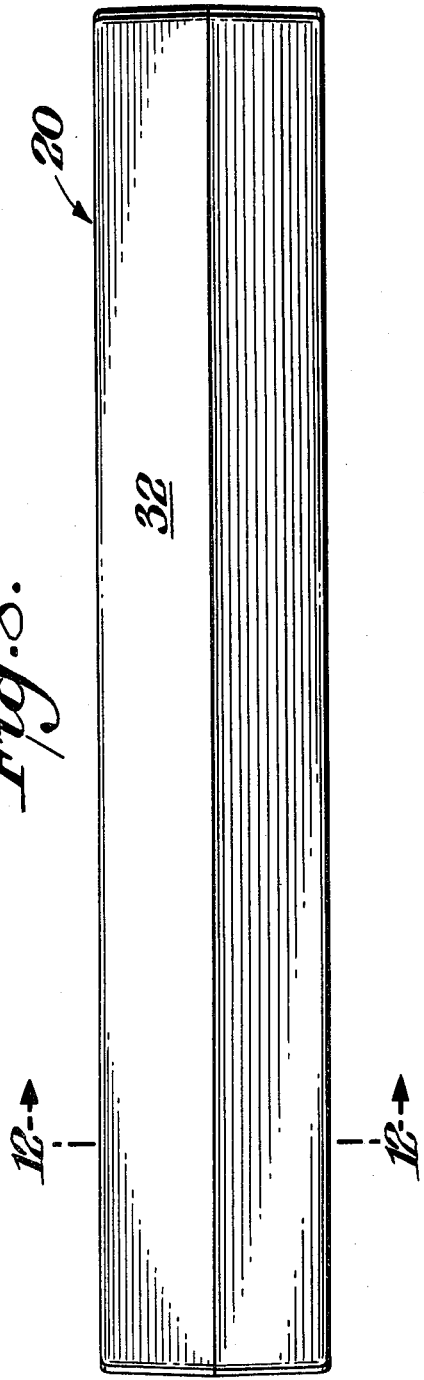
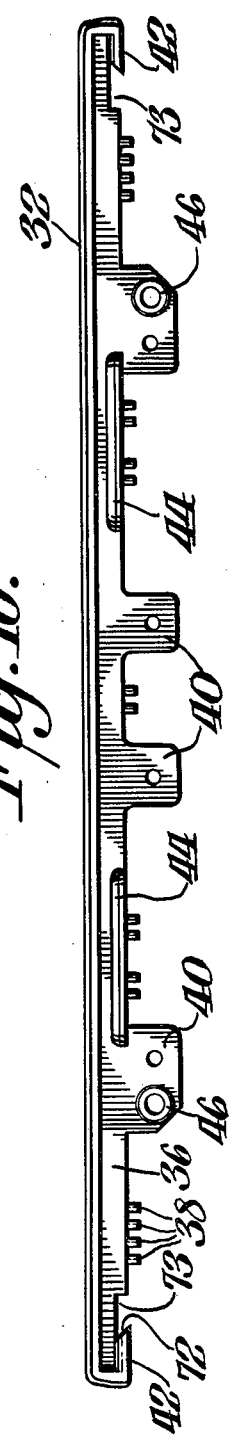

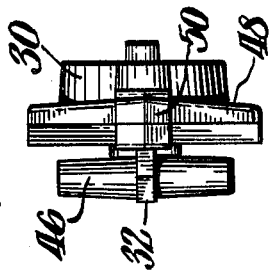
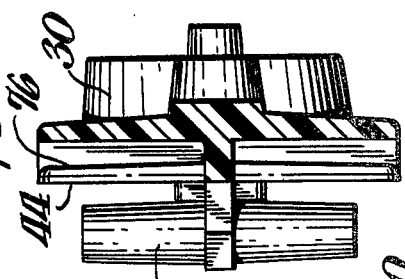
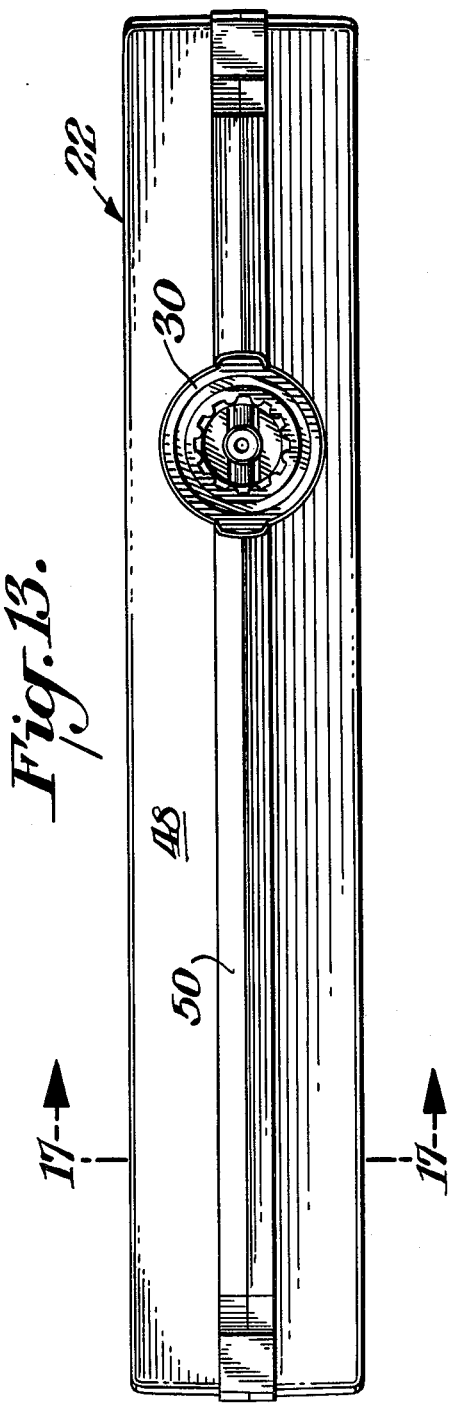
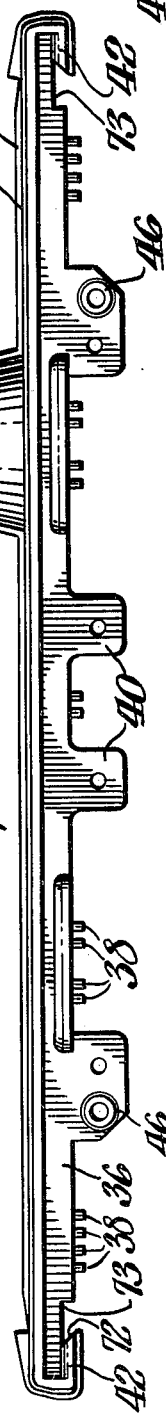
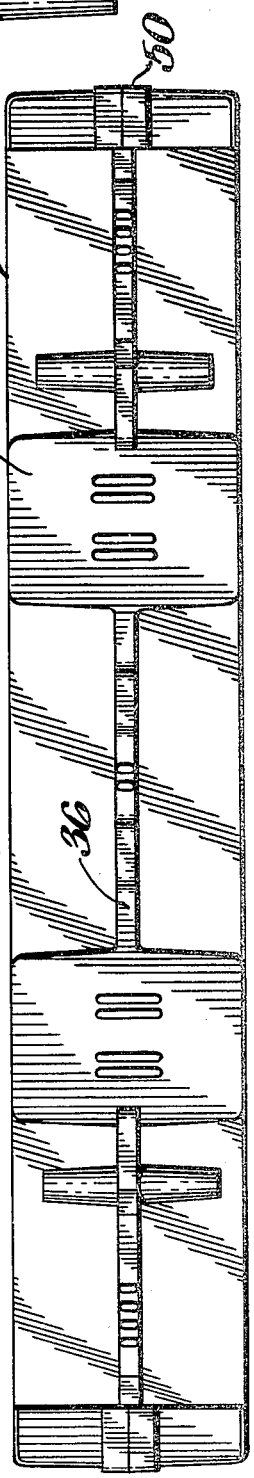

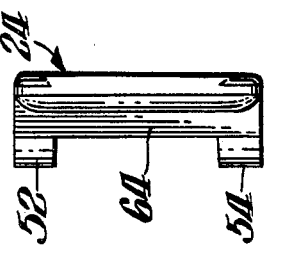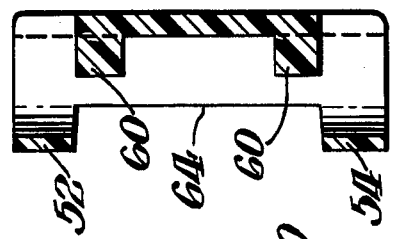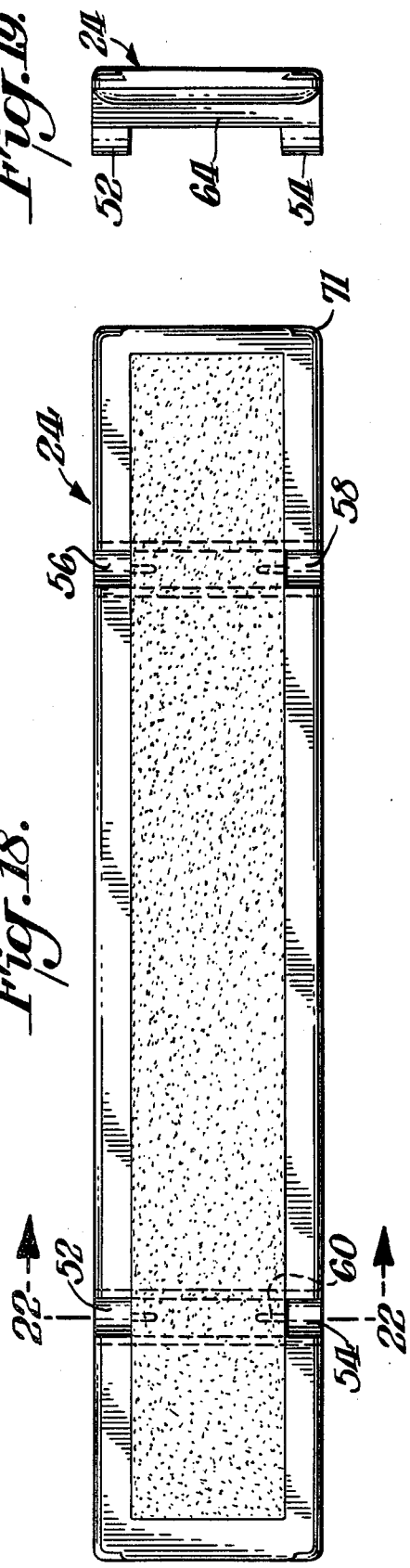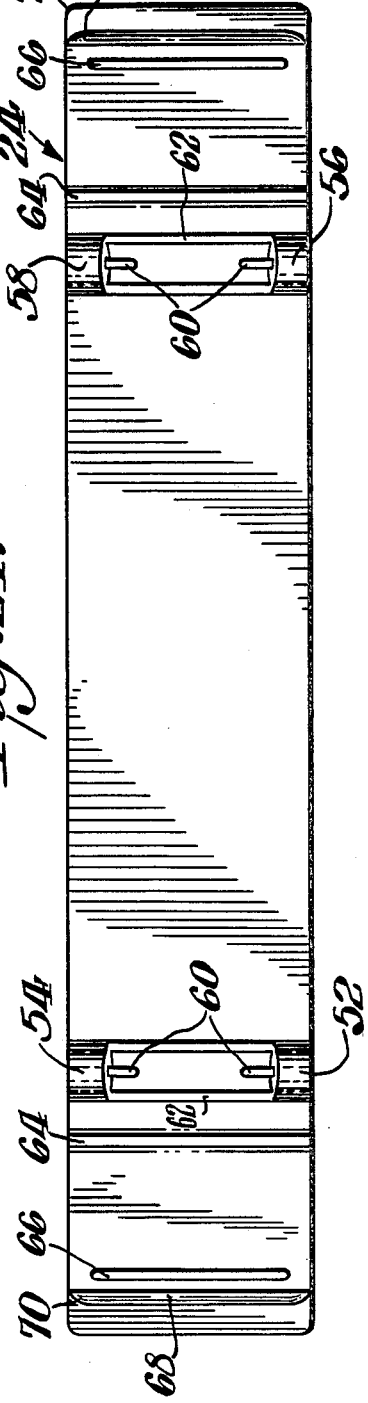

4,274,545

INSTRUMENT HOUSING

BACKGROUND OF INVENTION

U.S. Pat. No. 4,089,464 discloses an instrument housing which includes expanders for telescopically receiving the flanges of the upper and lower cover members. U.S. Pat. No. 4,090,632 is also pertinent in that respect. A CIP of U.S. Pat. 4,089,464, Ser. No. 905,747, now U.S. Pat. No. 4,196,821, issued Apr. 8, 1980 includes a variation thereof whereby the side walls of the housing are formed by providing a pair of such expanders with a filler plate therebetween.

SUMMARY OF INVENTION

An object of this invention is to provide an instrument housing of the above type which includes expanders having novel construction to facilitate the assembly thereof.

A further object of this invention is to provide such a housing wherein a pair of such expanders and a filler plate may be provided with complimentary structure.

In accordance with this invention, an expander of the general type disclosed in U.S. Pat. No. 4,089,464 includes as its inner wall structure thereof spaced wall segments. The wall segments are formed by providing inturned flanges at the ends of the outer wall and providing at least one flat plate shaped blade spaced from the outer wall by means of an interconnecting rib.

The handle may be secured to the housing by the provision of handle securing means on the outer wall in line with the blade.

Where a pair of such expanders are provided with a filler plate therebetween, the expanders and filler plate include complimentary structure to facilitate the assembly of the various components

THE DRAWINGS

FIG. 3 is a front view in elevation partly broken away in the assembly shown in FIGS. 1–2;

FIG. 4 is a cross-sectional view taken through FIG. 2 along the line 4—4;

FIG. 5 is a cross-sectional view taken through FIG. 2 along the line 5—5;

FIG. 6 is a elevation view showing the manner of assembling various components of the housing shown in FIGS. 1–5;

FIG. 7 is a plan view of a portion of one of the expanders shown in FIG. 6;

FIG. 8 is an elevation view of the upper expander shown in FIGS. 2–5 illustrating the outer wall thereof;

FIG. 9 is an end elevation view of the expander shown in FIG. 8;

FIG. 10 is a top plan view of the expander shown in FIGS. 8–9;

FIG. 11 is a side view showing the inner wall of the expander shown in FIGS. 8–10;

FIG. 12 is a cross-sectional view taken through FIG. 8 along the line 12—12;

FIG. 13 is an elevation view of the lower expander shown in FIGS. 2–5;

FIG. 14 is an end elevation view of the expander shown in FIG. 13;

FIG. 15 is a top plan view of the expander shown in FIGS. 13–14;

FIG. 16 is an elevation view of the expander shown in FIGS. 13–15 showing the inner wall thereof;

FIG. 17 is a cross-sectional view taken through FIG. 13 along the line 17—17;

FIG. 18 is an elevation view of a filler plate from the housing illustrated in FIGS. 2–5;

FIG. 19 is an end elevation view of the filler plate shown in FIG. 18;

FIG. 20 is a top plan view of the filler plate shown in FIGS. 18–19;

FIG. 21 is an elevation view showing the inner wall of the filler plate shown in FIGS. 18–20;

FIG. 22 is a cross-sectional view taken through FIG. 18 along the line 22—22;

DETAILED DESCRIPTION

Figure 1:
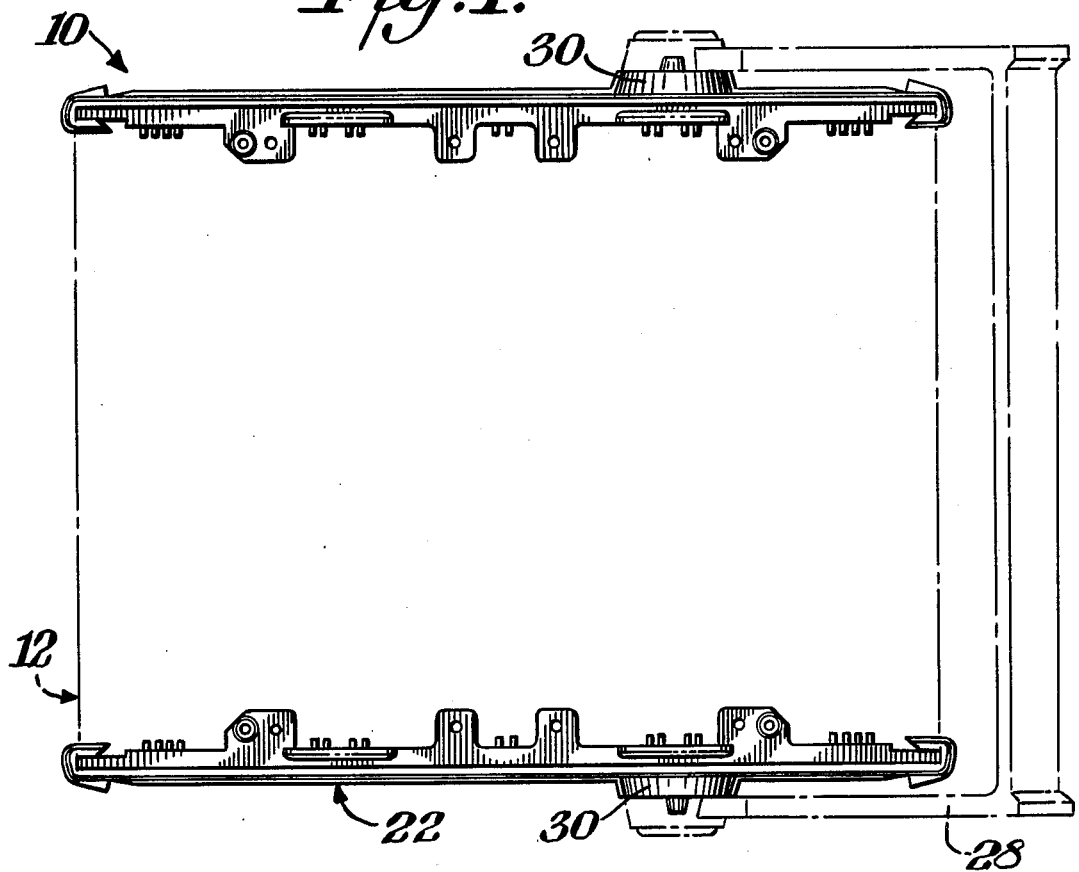
FIG. 1 is a plan view showing expanders in accordance with this invention with the housing and handle illustrated in phantom.
Figure 2:
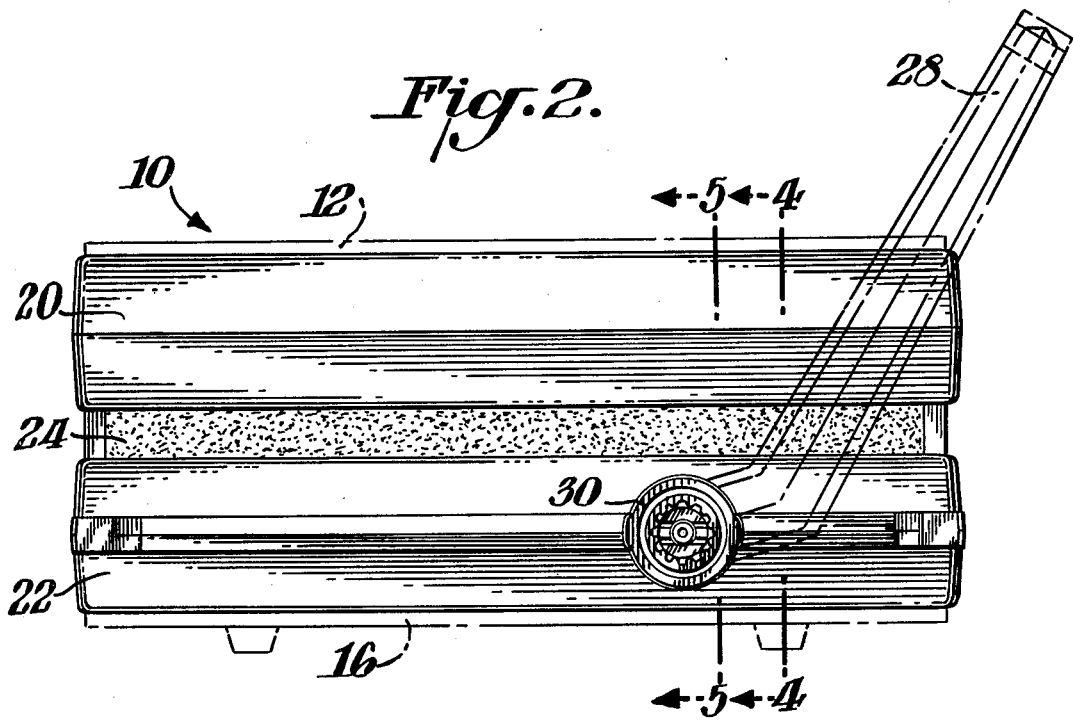
FIG. 2 is a side view in elevation of the assembly shown in FIG. 1.

The present invention relates to the improvements in instrument housing structure of the type disclosed in U.S. Pat. No. 4,089,464 and its continuation-in-part, Ser. No. 905,747, filed May 15, 1978 now U.S. Pat. No. 4,196,821, issued Apr. 8, 1980, the details of which are incorporated herein by reference thereto.

The basic components for the housing 10 in accordance with this invention include an upper cover 12 having downwardly directed flanges 14, a lower cover 16 having upwardly directed flanges 18; the side walls of the housing are formed by an upper expander 20 and a lower expander 22 which telescopically receives a filler plate 24 therebetween and which telescopically receives flanges 14, 18, respectively. End plates 26 of the type disclosed in U.S. Pat. No. 4,089,464 are also provided. As also described in U.S. Pat. No. 4,089,464, the end plates or panels fit into grooves or tracks on the inner surface at each end of the top and bottom covers and their flanges as shown in FIG. 3 of that patent and described in column 4, lines 38–41 thereof. (The expanders in the aforenoted patent also include longitudinal slots aligned with the grooves for likewise accommodating the end plates.) The specific shape of the housing is not critical and thus may vary in form. Similarly, although not essential, the housing includes a handle 28 which is received in handle securing means 30 on one of the expanders such as the lower expanders 22. The details of the handle structure are described in copending application Ser. No. 905,747, filed May 15, 1978 now U.S. Pat. No. 4,196,821, issued Apr. 8, 1980, and accordingly a repetition thereof herein is not necessary. Similarly, the expanders 20, 22 as well as other components of the housing include various structure to accommodate circuit cards and the like as described in U.S. Pat. No. 4,089,464.

The general structure of the expanders described in U.S. Pat. No. 4,089,464 is the inclusion of an outer wall and an inner wall spaced therefrom forming upper and lower channel sections for receiving the other components of the housing side walls. This invention is particularly directed to improved inner wall structure for the expanders as well as the filler plate.

FIGS. 8-12 show details of upper expanders 20. As indicated therein, upper expander 20 includes an outer wall 32 of generally the same configuration as the expanders illustrated and described in U.S. Pat. No. 4,089,464. Outer wall 32 similarly has an inwardly directed rib 36 which extends the length thereof and includes various projections 38 and flanges 40 similar to the type of structure disclosed in U.S. Pat. No. 4,089,464 as being on the inner wall thereof. FIG. 11 best illustrates the structure whereby inner wall 34 is of generally open construction and formed by a plurality of spaced wall segments. More particularly, these spaced wall segments comprise a pair of sections 42 which are formed by providing inturned flanges which extend from outer wall 32 as illustrated in FIG. 10. Further, FIG. 11 illustrates a pair of spaced apart generally flat plate shaped blades 44 which likewise comprise wall segments. As shown in FIG. 11, there are substantial open spaces between blades 44 and inturned flanges 42.

FIGS. 9-12 further illustrate that expander 20 includes apertured posts 46 extending from rib 36 above and below rib 36. As best shown in FIGS. 9, 11 and 12, posts 46 taper inwardly slightly from rib 36 toward their outer ends.

FIGS. 13-17 illustrate the details of lower expander 22. In general the structure is the same as upper expander 20 except that handle securing means 30 is provided on outer wall 48. Additionally, outer wall 48 includes reinforcing rib 50 similar to the reinforced rib described in U.S. Pat. No. 4,089,464. Otherwise the structural details of lower expander 24 are the same as the upper expander 20 and thus like reference numerals are used for like parts. It is significant, however, that handle securing means 30 is located in line with one of blades 44. This blade thereby aids in supporting the handle should, for example, the housing be laid on its side.

FIGS. 18-22 illustrate the details of filler plate 24. FIller plate 24 may be textured on its outer side as illustrated in FIG. 18. As best shown in FIGS. 20-21, filler plate 24 includes on its inner face a plurality of loops 52, 54, 56, 58. Loops 52, 54, 56, 58 are located opposite cutout portions (FIG. 22) on the inner surface. Additionally, a thin stud 60 is provided for each loop on the inner surface of filler plate 24 as later described. Loops 52, 54 are interconnected by a stiffener 62 as well as loops 56, 58 with the stiffener 62 being channel shaped. Filler plate 24 further includes projections 64, 66 which extend across the width thereof to act as additional stiffeners.

As best shown in FIGS. 20-21, beveled projections 68 are also provided at each end of filler plate 24 with the ends thereof rounded at 70 (FIG. 21) to act as camming surfaces as later described. Inturned flanges 42 have complementary bevels 72.

As shown in FIG. 6, the unit comprising upper expander 20, lower expander 22 and filler plate 24 is assembled by sliding each expander and filler plate toward each other. Initially, filler plate 24 becomes telescoped in the space between blades 44 and the outer wall of the expanders. Rounded corners 71 on plate 24 facilitate plate 24 sliding beneath inturned ends 42. If there should be some slight misalignment such misalignment is corrected by bevels 72 riding on a cam surface 70 until the bevels 72 are guided against bevel projections 68. Thus, projections 68 act as a guide track for the beveled surface 72 of flanges 42 to properly index the expanders with respect to the filler plate. This proper indexing assures that apertured posts 46 slide within loops on filler plate 24 and rest over studs 60. The slight taper of posts 46 facilitates this sliding action. When in the fully telescoped position, posts 46 are also received in channel shaped stiffeners 62 as shown, for example, in FIG. 5.

Blades 44 have a plurality of functions. For example, the blades provide convenient areas to which cement may be applied should it be desired to permanently lock the components of housing 10. Additionally, blades 44 act to direct or guide the filler plates 24 in the expander slots formed by the inner wall and outer wall of each expander. Further, while so guiding the filler plates, blades 44 further function to press the filler plates against the outer wall of each expander thus holding the filler plates rigid and minimizing gaps therebetween. As shown in FIG. 5, the outer edges 74 of blades 44 which are disposed toward the outer wall of each expander are rounded to likewise function as a camming surface in facilitating the telescopic sliding action of filler plate 24. In this respect, the surface 76 (FIGS. 12 and 17) of blades 44 may taper slightly so that there is a larger space between blade 44 and the outer wall of each expander at rounded edge 74 than there is at rib 36.

The various stiffeners and in particular stiffeners 62 function to minimize any bending of filler plate 24. Similarly, loops 52, 54, 56, 58 restrain or minimize any bending of filler plate 24 and of posts 46 by virtue of posts 46 being telescoped therein. Moreover, the loops also act as guides for posts 46. Additionally, studs 60 function to support posts 46 by their location in the area between posts 46 and the inner surface of plate 24.

Stiffeners 66 have the added functions of providing a track to guide end panels 26 during assembly of the end panels to housing 10. Ribs 36 are recessed at 73 to accommodate panels 26. As shown in FIG. 6, blades 44 are spaced laterally away from the panel tracks.

As shown in FIG. 4, the housing is secured together by inserting a threaded fastener 78 through recessed feet 80 and then through hollow bosses 82 and next through pairs of aligned apertured posts 46 for engagement with threaded bosses 84. Such means of securement is generally similar to that described in U.S. Pat. No. 4,089,464 where each corner of the housing is provided with threaded bosses in the upper cover and hollow bosses and feet for the lower cover aligned therewith. The arrangement of this invention is particularly advantageous since in addition to the aforenoted fastening elements the provision of stiffeners 62 and the loops results in a rigid unit which spans the housing from the upper cover to the lower cover interiorly of the housing. The resultant structure is a very rigid housing. Additionally this rigid spanning avoids a problem which might otherwise exist. In this respect boss 84 is threaded by means of threaded insert 86. If there were not a solid or rigid spanning, then the manipulation of threaded fastener or screws 78 might otherwise tend to lift the threaded insert 86 from its boss 84.

Figure 23:
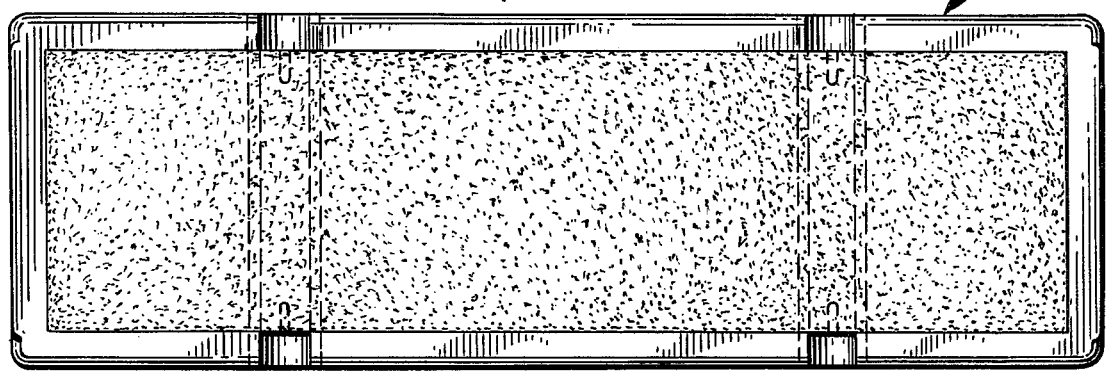
FIG. 23 is an elevation view of a modified form of filler plate.

The invention may be practiced with various structural changes. FIG. 23, for example illustrates a filler panel 24A which is wider than panel 24. Additionally, if desired, the filler panels may be utilized to display a logo or as a means of advertisement and such advertisement may be readily changed by simply replacing the filler panels.

Figure 24:
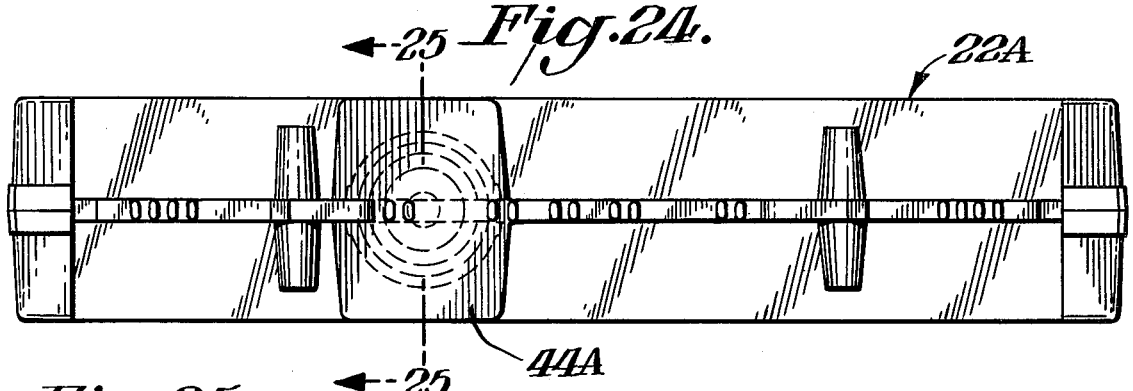
FIG. 24 is an elevation view of a modified form of expander.
Figure 25:
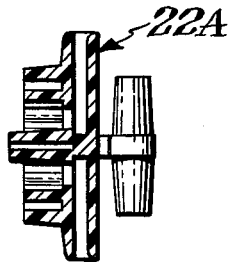
FIG. 25 is a cross-sectional view taken through FIG. 24 along the line 25—25.

FIG. 24 illustrates a further modification of this invention wherein each expander is provided with a single plate 44A.

FIG. 5 further illustrates spacers being provided between the bosses 82 and 84 and posts 46 similar to the spacers as described in U.S. Pat. No. 4,089,464. The use of such spacers maintain the rigid spanning concept while providing for increased possibilities of size adjustment. Further, the use of a pair of expanders doubles the possibility of the number of guide cards etc. which may be accommodated in housing 10.

It is also within the concept of this invention to provide more than two expanders for each side wall whereby a filler plate would be located between each pair of expanders. Obviously other variations are possible within the concept of this invention.

What is claimed is:

1. In an expander for forming a side wall of an electrical housing or the like having end panels fit into tracks on the inner surface of the housing wherein said expander is of generally rectangular shape with upper and lower horizontal channel sections formed by an outer wall and an inner wall spaced therefrom with a rib laterally therebetween separating said channel sections for telescopically receiving a pair of side members with one of said side members sliding downwardly into the space between said outer wall and said inner wall and the other of said side members sliding upwardly into said space between said outer wall and said inner wall, the improvement being said inner wall being of generally open construction comprising a plurality of spaced wall segments, said outer wall having an inturned flange at each of its ends thereof, said inturned flanges comprising two of said wall segments which are adapted to fit against the end panel tracks, said rib being on said outer wall projecting toward said inner wall, a generally flat plate-shaped blade mounted to said rib and extending both upwardly above and downwardly below said rib, and said blade comprising a further of said wall segments with substantial open spaces between said blade and each of said inturned flanges whereby said blade is adapted to be spaced laterally away from the end panel tracks.

2. The expander of claim 1 including handle securing means on said outer wall in line with said blade whereby said blade provides support means for the handle.

3. The expander of claim 1 wherein said inturned flanges are beveled with pointed edges remote from said outer wall to act as guide tracks.

4. The expander of claim 1 including a pair of said blades mounted on said rib and spaced from each other.

5. The expander of claim 1, in combination therewith, a second expander, said second expander being a lower expander and the first expander being an upper expander, and a generally rectangular filler plate of generally the same thickness as the spacing between said inner and outer walls of said expanders being telescopically received between a respective set of inner and outer walls of said upper expander and said lower expander.

6. The combination of claim 5 wherein said filler plate includes an inner face disposed toward said blade and an outer face disposed toward said outer wall of said expander and includes upper and lower edges connecting said inner face and said outer face, said inner face of said filler plate having a first pair of inwardly disposed loops extending from said lower edge and a second pair of inwardly disposed loops extending from said upper edge in line with said first pair of loops, and said loops being laterally displaced from said blades whereby said upper and lower edges of said filler plate may slide beyond the outer edges of said blades when being telescopically received by said expanders.

7. The combination of claim 6 wherein each of said ribs on each of said expanders includes an inwardly disposed apertured longitudinal post extending into a respective one of said loops whereby a fastener may be inserted therethrough.

8. The combination of claim 7 wherein the aligned loops of said first and second pairs are interconnected by a stiffener, and said stiffeners being channel shaped with its respective posts located therein.

9. The combination of claim 8 wherein said filler plate is provided with a stud disposed beneath each of said loops, and each of said posts being tapered for riding over its respective stud when being inserted into its respective loop.

10. The combination of claim 6 wherein the aligned loops of said first and second pairs are interconnected by a stiffener.

11. The combination of claim 5 wherein track means are mounted on each of said expanders and on said filler plate.

12. The combination of claim 11 wherein said track means includes a beveled projection at each end of said filler plate, said beveled projections being parallel to each other and to the outer edges of said inturned flanges, and said beveled projections extending substantially longitudinally completely across said filler plate.

13. The combination of claim 12 wherein each of said inturned flanges has a complementary bevel to said beveled projections.

14. The combination of claim 13 including a further projection at each end of said filler plate parallel to and slightly spaced from its said beveled projection to provide a track for an end panel of the housing to be inserted therebetween.

15. The combination of claim 13 wherein each end of each of said beveled projections is rounded to provide a camming surface.

16. The combination of claim 5 wherein one of said expanders includes handle securing means on its said outer wall in line with said blade whereby said blade provides support means for the handle.

17. The combination of claim 5 wherein each of said expanders includes a pair of said blades mounted on its rib and spaced from each other.

18. The combination of claim 5 wherein each of said blades has an inner edge remote from said rib, and said remote inner edge being rounded, and said blades being slightly inclined outwardly away from said outer face creating a tapered channel therebetween to provide a tight fit for said filler plate at said rib.

19. The combination of claim 5, in further combination therewith, a second set of upper and lower expanders and a filler plate, a top cover having downwardly directed flanges telescopically received in said upper expanders, and a bottom cover having upwardly directed flanges telescopically received in said lower expanders.

20. The combination of claim 19 including a threaded boss in each corner of said upper cover adjacent to and parallel to said downwardly directed flanges, a hollow boss in each corner of said lower cover, each of said hollow bosses being aligned with a respective threaded boss, said filler plate including an inner face disposed toward said blade and an outer face disposed toward said outer wall of said expander and includes upper and lower edges connecting said inner face and said outer face, said inner face of said filler plate having a first pair of inwardly disposed loops extending from said lower edge and a second pair of inwardly disposed loops extending from said upper edge in line with said first pair of loops, said loops being laterally displaced from said blades whereby said upper and lower edges of said filler plate may slide beyond the outer edges of said blades when being telescopically received by said expanders, each of said ribs on each of said expanders includes an inwardly disposed apertured longitudinal post extending in one direction into a respective one of said loops and in the other direction abutting against a respective one of said bosses, the aligned loops of said first and second pairs being interconnected by a stiffener, said stiffeners being channel shaped with its respective posts located therein, a fastener being inserted through a respective set of hollow post and apertured bosses and secured to a respective threaded boss, and each set of said hollow post and apertured bosses and aligned loops and stiffener and threaded boss being in contact with each other to form a rigid unit spanning said upper cover and lower cover interiorly of said housing.

21. In an electrical housing or the like having a top cover with downwardly directed flanges and a bottom cover with upwardly directed flanges and with side walls and with end panels held in tracks on the inner surface of the housing, wherein each of said side walls includes a generally rectangularly shaped expander having an outer wall spaced from an inner wall and said outer and inner walls being laterally interconnected by a rib therebetween to form a pair of upper and lower channel sections, the improvement being each of said side walls comprising a lower one of said expanders and an upper one of said expanders with a filler plate therebetween, the inner surface of said filler plate including said end panel tracks, said inner wall of each of said expanders being of generally open construction comprising a plurality of spaced wall segments, said outer wall of each of said expanders having an inturned flange at each of its ends thereof disposed adjacent said end panel tracks, said inturned flanges comprising two of said wall segments, said rib being on said outer wall projecting toward said inner wall, a generally flat plate shaped blade mounted to said rib and extending upwardly above and downwardly below said rib, said blade comprising a further of said wall segments with substantial open spaces between said blade and each of said inturned flanges with said blade spaced from said end panel tracks, said downwardly directed flanges of said top cover being telescoped into said upper channel sections of said upper expanders, said upwardly directed flanges of said bottom cover being telescoped into said lower channel sections of said lower expanders, and said filler plates being telescoped into said lower channel sections of said upper expanders and into said upper channel sections of said lower expanders.

22. A filler plate for securement between an upper expander and a lower expander for forming a side wall of an electrical housing or the like wherein each expander is of generally rectangular shape with upper and lower channel sections formed by an outer wall and an inner wall spaced therefrom with a rib laterally therebetween for telescopically receiving complementary side members, said filler plate being of generally the same thickness as the spacing between said inner and outer walls of said expanders and being telescopically received between a respective set of inner and outer walls of said upper expander and said lower expander, said filler plate having an inner face and an outer face with upper and lower edges connecting said inner face and said outer face, said innner face of said filler plate having a first pair of inwardly disposed loops extending from said lower edge and a second pair of inwardly disposed loops extending from said upper edge in line with said first pair of loops for receiving longitudinal posts on the expanders, and said aligned loops of said first and said second pairs being interconnected by a stiffener.

23. The filler plate of claim 22 including longitudinal track means at each end of said filler plate for receiving end panels of the housing, said track means including a pair of projections extending longitudinally across said filler plate, an the outermost of said projections being beveled and terminating at each end in a rounded camming surface.

* * * * *